United States Patent [19]
Watanabe

[11] Patent Number: 5,305,271
[45] Date of Patent: Apr. 19, 1994

[54] CIRCUIT FOR CONTROLLING AN OUTPUT OF A SEMICONDUCTOR MEMORY

[75] Inventor: Hiroshi Watanabe, Tokyo, Japan

[73] Assignee: NEC Corporation, Tokyo, Japan

[21] Appl. No.: 650,604

[22] Filed: Feb. 5, 1991

[30] Foreign Application Priority Data

Feb. 6, 1990 [JP] Japan .................. 2-27605

[51] Int. Cl.⁵ .................... G11C 7/00; G11C 8/00
[52] U.S. Cl. ....................... 365/205; 365/189.05;
365/189.08; 307/473; 307/272.3
[58] Field of Search ........... 365/205, 189.01, 189.03,
365/189.05, 189.08; 307/473, 475, 480, 272.3

[56] References Cited

U.S. PATENT DOCUMENTS 4,397,001 8/1983 Takemae ................ 365/189.05
5,046,180 9/1991 Ueda et al. .............. 365/189.03

*Primary Examiner*—Timothy P. Callahan
*Attorney, Agent, or Firm*—Leydig, Voit & Mayer

[57] ABSTRACT

In a circuit for controlling an output of a semiconductor memory, the supply of output data to an output terminal is carried out in accordance with an output of a flip-flop. The flip-flop is set when both a row address strobe signal and a column address strobe signal are active, and is reset when the row address strobe signal is active, the column address strobe signal is inactive and a write enable signal is active, so that the supply of the output data is maintained even after the column address strobe signal becomes inactive, and is stopped when the write enable signal becomes active. Therefore, input and output operations can be carried out without any error even on condition that input and output terminals of the semiconductor memory are common and that the operations are carried out in a page mode.

14 Claims, 4 Drawing Sheets

CIRCUIT FOR CONTROLLING AN OUTPUT OF A SEMICONDUCTOR MEMORY

FIELD OF THE INVENTION

This invention relates to a circuit for controlling an output of a semiconductor memory, and more particularly to, an address multiplexing output control circuit of a semiconductor memory having an extended output.

BACKGROUND OF THE INVENTION

In a first conventional output control circuit of a semiconductor memory, an address in the semiconductor memory is designated by a row address strobe (RAS) signal and a column address strobe (CAS) signal, and output data is supplied only if the RAS signal and the CAS signal are both at a low level. In the output control circuit, an access time by the CAS signal is equal to the minimum pulse width of the CAS signal which is required for an output operation. A level of the CAS signal must become high to turn an output terminal into a high impedance state simultaneously with the supply of the output data. Therefore, there is no stable state for the output data if a pulse width of the CAS signal which is in active state is equal to the minimum pulse width thereof, so that there is no time to supply the output data to an external circuit. This tendency especially occurs when the memory is operated in a so called page mode. Therefore, an actual pulse width of the CAS signal for the supply of the output data is the sum of a stable level time of the output level and the minimum pulse width of an access.

In a second conventional output control circuit of a semiconductor memory, there is provided with an extended output in which the output data is maintained even after the CAS signal becomes inactive. In operation, after the output data is supplied from an accessed memory cell to the output circuit by turning the RAS signal and the CAS signal into low, the output data is maintained at the output circuit until either the CAS signal turns into low again to access another address of the semiconductor memory after once turning into high, or both the RAS signal and the CAS signal turns into high. Practically, the output data is maintained to be supplied during a predetermined time including a precharging time of the CAS signal, so that a cycle for the page mode operation can be minimum.

According to the first and second conventional output control circuits of a semiconductor memory, however, there are disadvantages as described below.

In the first conventional output control circuit of a semiconductor memory, a minimum cycle of output operation which is a pulse width of the CAS signal becomes long, because the actual pulse width of the CAS signal is the sum of a stable level time of the output level and the minimum pulse width of the access as described above.

In the second conventional output control circuit of a semiconductor memory, the output operation of the page mode can not be carried out if the structure of the memory is such that input and output terminals are connected common (defined as "I/O common structure" hereinafter), for the reason that a wrong writing operation may occur, because the output data is maintained to be supplied at the output circuit even when the input data begins to be supplied to the common by connected input terminal. Therefore, the page mode can not be carried out with the I/O common structure, so that the ordinary mode must be carried out. However, the ordinary mode operation takes more time to carry out one memory cycle compared to the page mode operation. For instance, if the access time from the RAS signal is 100 ns, one memory cycle of the ordinary mode operation may become 190 ns, while that of the page mode operation may become 90 ns, so that the page mode operation is preferred for high speed accessing.

On the other hand, the I/O common structure is necessary for high density packaging such as a module for surface packaging of semiconductor memories. In such a module as having nine semiconductor memories each having a capacity of 1 Mega bits, the number of terminals necessary for input/output operation in the I/O common structure is 24, that is the sum of 2 for power supply and ground, 3 for the RAS signal, the CAS signal and a write enable (WE) signal, 10 for address access signals, and 9 for input and output signals. On the other hand, the number of necessary terminals is 33 in a separate I/O structure where input terminals and output terminals are provided separately. Accordingly, the width of the module in the separate I/O structure becomes approximately 8.4 cm, which is 1.4 times larger than that in the I/O common structure which is approximately 6.1 cm, so that the I/O common structure is essential for getting a smaller sized device.

SUMMARY OF THE INVENTION

Accordingly, it is an object of the invention to provide a circuit for controlling an output of a semiconductor memory having an extended output in which the input and output operation can be carried out simultaneously without wrong operation in the page mode by adopting the I/O common structure.

According to a feature of the invention, a circuit for controlling an output of a semiconductor memory including a set signal generating circuit for generating a set signal having a logical level dependent on a row address strobe signal and a column address strobe signal. A reset signal generating circuit generates a reset signal having a logical level dependent on the row address strobe signal, the column address strobe signal, and a write enable signal. A flip-flop is coupled to the set signal generating circuit and to the reset signal generating circuit. The flip-flip is set by the set signal and reset by the reset signal. An output data retaining circuit is coupled to the semiconductor memory cell. The output data retaining circuit retains data read from the semiconductor memory cell. An output circuit is coupled to the output data retaining circuit. The output circuit outputs data read from the semiconductor memory cell. A drive circuit is coupled to the flip-flop, the output data retaining circuit, and the output circuit. The drive circuit controls the output circuit to output data from the semiconductor memory cell when the flip-flop is set. The drive circuit controls the output circuit to be in a high impedance state regardless of the contents of the data when the flip-flop is reset.

BRIEF DESCRIPTION OF THE DRAWINGS

The invention will be explained in more detail in conjunction with appended drawings wherein.

DESCRIPTION OF THE PREFERRED EMBODIMENTS

Before explaining a circuit for controlling an output of a semiconductor memory according to the invention, operation of the conventional output control circuits of a semiconductor memory described briefly before will be explained in FIGS. 1 to 3.

Figure 1:
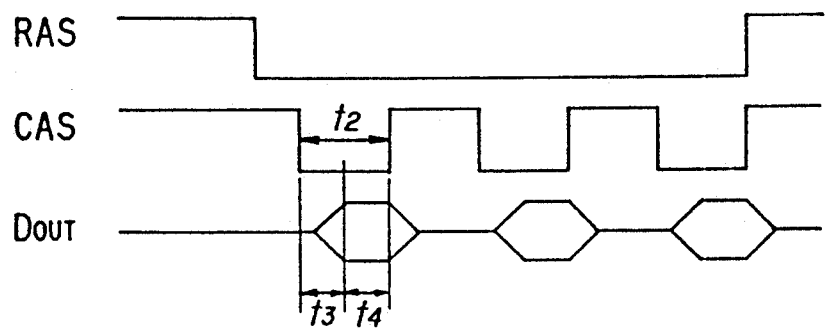
FIG. 1 is a timing chart showing timing of signals in a first conventional output control circuit of a semiconductor memory.

FIG. 1 is a timing chart showing timing of signals in a first conventional output control circuit of a semiconductor memory. In this case, the minimum cycle of output operation which is the pulse width $t_2$ of the CAS signal is the sum of the minimum pulse width $t_3$ of the CAS signal and a stable level time $t_4$ of the output $D_{OUT}$.

Figure 2:
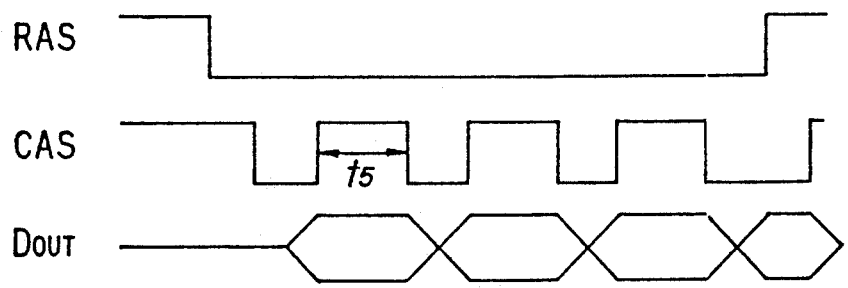
FIG. 2 is a timing chart showing timing of signals in a second conventional output control circuit of a semiconductor memory.

FIG. 2 is a timing chart showing timing of signals in a second conventional output control circuit of a semiconductor memory having an extended output. In this case, after an address is accessed by turning the RAS and CAS signals into low, the output data $D_{OUT}$ is maintained to be supplied at the output circuit until either the CAS signal turns into low again to access another address of the semiconductor memory after once turning into high, or both the RAS and CAS signals turn into high. In this case, the output data $D_{OUT}$ is maintained to be supplied at the output circuit during a time including a precharging time of the CAS signal.

Figure 3:
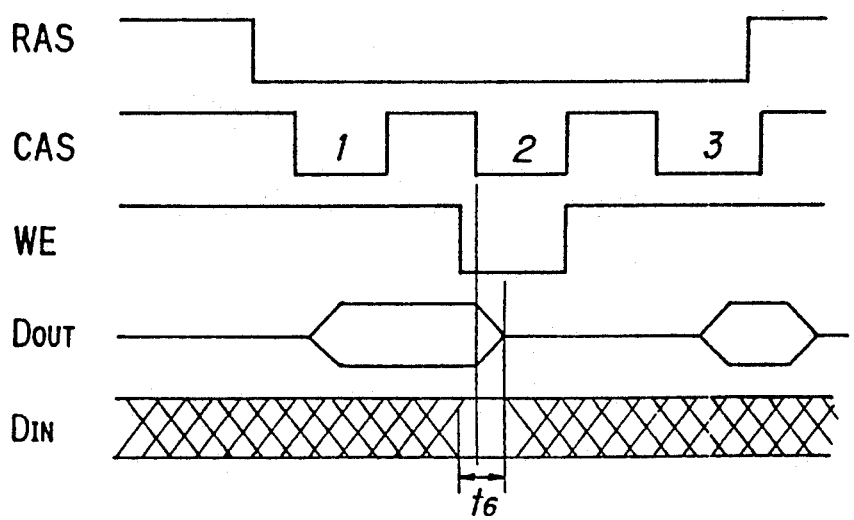
FIG. 3 is a timing chart showing timing of signals in a third conventional output control circuit of a semiconductor memory.

FIG. 3 is a timing chart showing timing of signals in a third conventional output control circuit of a semiconductor memory having an extended output, in which the I/O common structure is adopted.

The CAS signal is turned set to be low (active), as shown by the numerical letters "1", "2" and "3", during the "low" level of the RAS signal. Here, it is assumed that the first and third cycle "1" and "3" are cycles for "read", and the second cycle "2" is a cycle for "write". In the "read" cycle "1" and "3", the output data $D_{OUT}$ are supplied to the output circuit, and maintained at the output circuit even after the "write" cycle "2" starts. On the other hand, the input data $D_{IN}$ is required to be fixed at the commonly connected input/output terminal before the "write" cycle "2" starts. As a result, the output data $D_{OUT}$ and the input data $D_{IN}$ collide with each other on a common input/output lead during a period "$t_6$", so that the input data $D_{IN}$ is not fixed to result in a wrong write of data into the memory cell. This means that the page mode operation can not be carried out, but ordinary operation, in which the RAS signal is generated for each bit, must be carried out, when "read" and "write" operation is carried out simultaneously.

Figure 4:
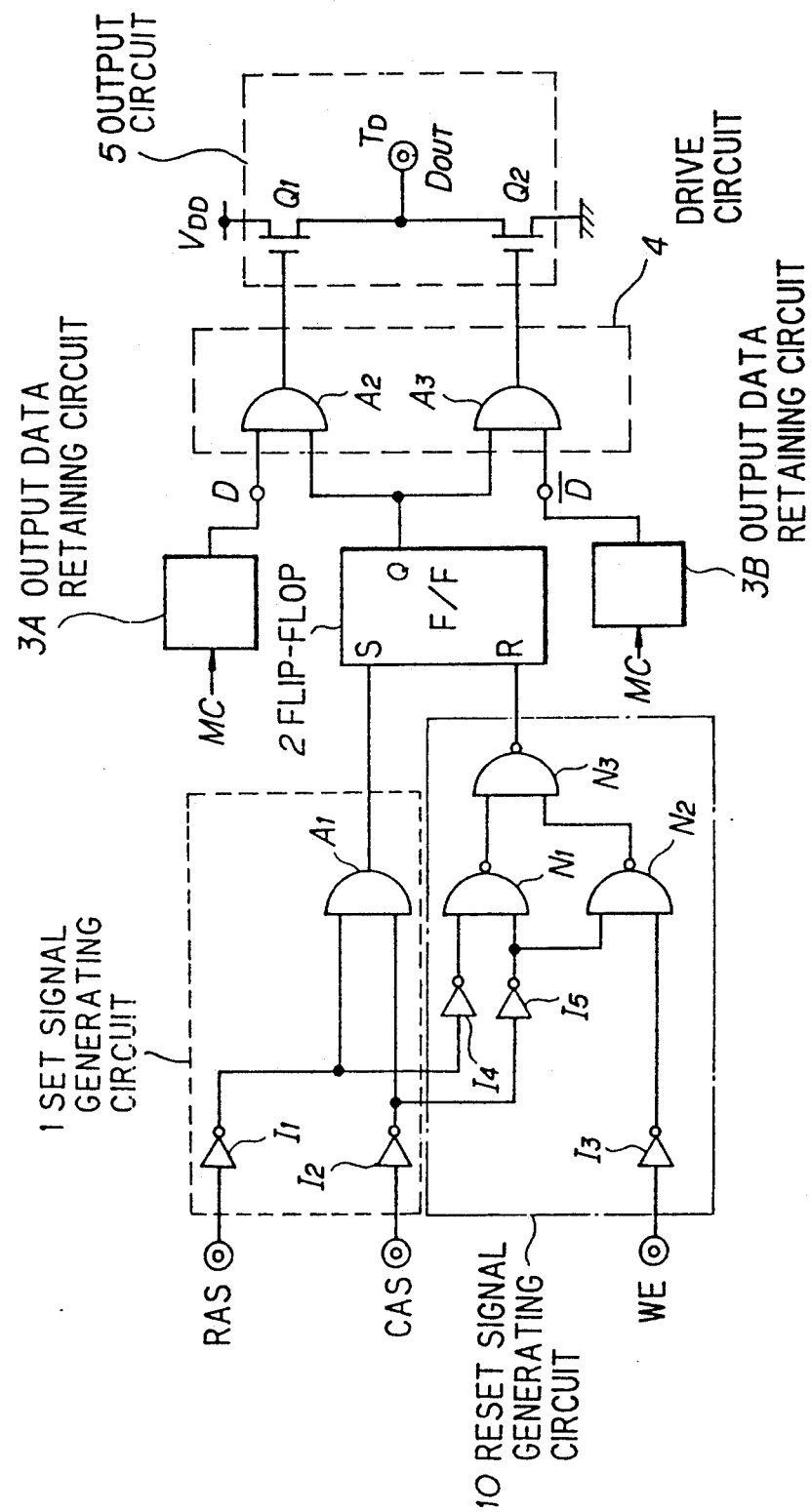
FIG. 4 is a block diagram of a circuit for controlling an output of a semiconductor memory in a first preferred embodiment according to the invention.

Next, FIG. 4 is a block diagram of a circuit for controlling an output of a semiconductor memory in a first preferred embodiment according to the invention. The output control circuit comprises a flip-flop 2 which is set and reset by set and reset signal generating circuits 1 and 10, a pair of output data retaining circuits 3A and 3B which retain output data read from a memory cell MC, a drive circuit 4 which generates a drive signal in accordance with the output data of the output data retaining circuits 3A and 3B and an output of the flip-flop 2, and an output circuit 5 which supplies output data $D_{OUT}$ read from the memory cell MC.

In the set signal generating circuit 1, the RAS and CAS signals are supplied respectively to inverters $I_1$ and $I_2$ which buffer the RAS and CAS signals, and outputs of the inverters $I_1$ and $I_2$ are supplied to an AND circuit $A_1$ whose output is then supplied as a set signal to a set terminal S of the flip-flop 2.

The reset signal generating circuit 10 consists of three inverters $I_3$, $I_4$ and $I_5$ and three NAND circuits $N_1$, $N_2$ and $N_3$. The inverter $I_3$ is supplied with a WE signal to supply an inverted output to the NAND circuit $N_2$. The inverter $I_4$ is supplied with an output of the inverter $I_1$ to supply a reinverted output of the RAS signal to the NAND circuit $N_1$. The inverter $I_5$ is supplied with an output of the inverter $I_2$ to supply a re-inverted output of the CAS signal to the NAND circuits $N_1$ and $N_2$. The NAND circuit $N_1$ is supplied with the outputs of the inverters $I_4$ and $I_5$ to supply an output to the NAND circuit $N_3$. The NAND circuit $N_2$ is supplied with the outputs of the inverters $I_3$ and $I_5$ to supply an output to the NAND circuit $N_3$. The NAND circuit $N_3$ is thus supplied with the outputs of the NAND circuits $N_1$ and $N_2$ to supply an output as a reset signal to a reset terminal R of the flip-flop 2.

The drive circuit 4 consists of two AND circuits $A_2$ and $A_3$. The AND circuit $A_2$ is supplied with an output D of the output data retaining circuit 3A and an outout of the flip-flop 2. The AND circuit $A_3$ is supplied with a complementary output $\overline{D}$ of the output data retaining circuit 3B and the output of the flip-flop 2.

The output circuit 5 consists of two transistors Q1 and Q2. The transistor Q1 is connected at a gate terminal to an output of the AND circuit $A_2$ of the drive circuit 4, at a drain terminal to a power supply $V_{DD}$ and at a source terminal to the output terminal $T_D$. The transistor Q2 is connected at a gate terminal to an output of the AND circuit $A_3$ of the drive circuit 4, at a drain terminal to the output terminal $T_D$ and at a source terminal to ground.

In operation, the set signal becomes high only if both the RAS and CAS signals are low. On the other hand, the reset signal becomes high if both the RAS and CAS signals are high, or if the RAS and WE signals are low and the CAS signal is high. The output terminal Q of the flip-flop 2 becomes high when the set input terminal S is high, and becomes low when the reset input terminal R is high. In the drive circuit 4, either of outputs of the AND circuits $A_2$ or $A_3$ becomes high dependent on a content of the memory cell MC, if the output terminal Q of the flip-flop 2 is high, so that either of the transistors Q1 or Q2 becomes ON state to supply the output terminal $T_D$ with either the output $V_{DD}$ or ground level as the output data $D_{out}$.

Consequently, the output terminal $T_D$ is supplied with the output data $D_{out}$ when both the RAS and CAS signals are low (active) and is maintained to be supplied with the output data $D_{out}$ until the signal condition becomes such that both the RAS and CAS signals becomes high (inactive) or that the RAS and WE signals become low and the CAS signal becomes high. If these signals become this signal condition, both the transistors Q1 and Q2 become OFF state to turn the output terminal $T_D$ into high impedance.

Figure 5:
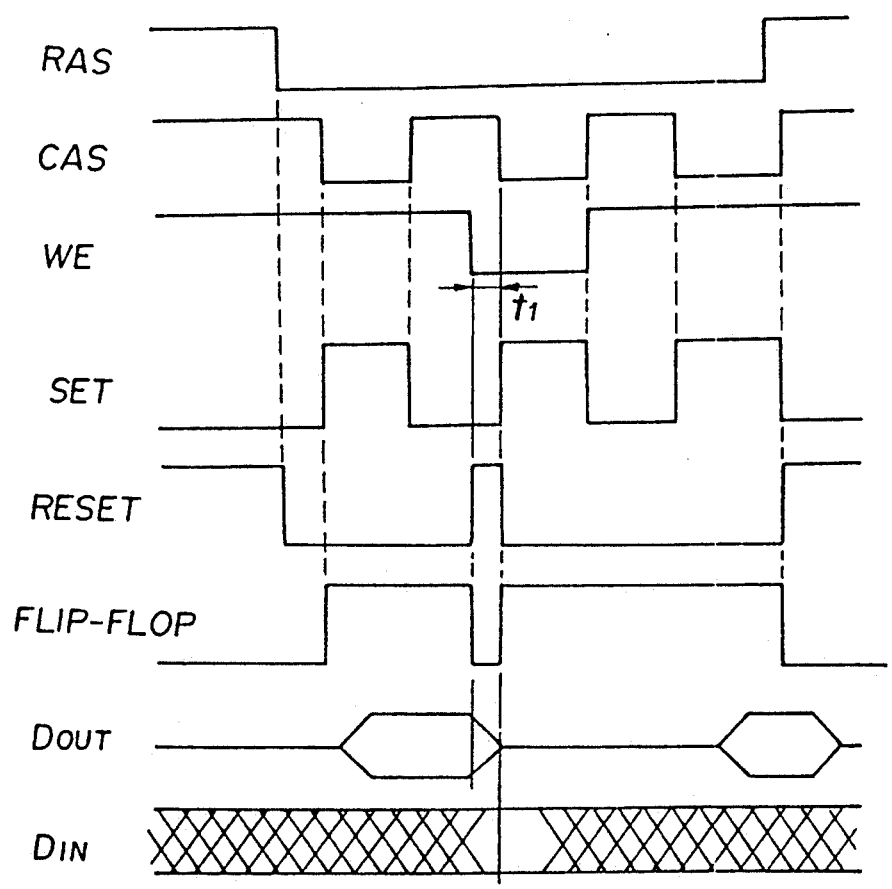
FIG. 5 is a timing chart showing timing of signals in the circuit for controlling an output of a semiconductor memory in the first preferred embodiment.

The above operation is shown in a timing chart of FIG. 5, and will be explained again in connection with the page mode operation. First, the RAS signal becomes low and does not change until a predetermined number of input or output operation cycles are carried out. It is supposed that the first cycle is for output (read) operation and the second one is for input (write) operation. In this case, the output terminal $T_D$ is supplied with the output data $D_{OUT}$ when the CAS signal becomes low to be active as the first cycle. The output data $D_{OUT}$ remains supplied to the output terminal $T_D$ even when the CAS signal becomes high, and the supply of the output data $D_{OUT}$ stops when the WE signal becomes low to be active due to the low output level of the flip-flop 2, so that the output terminal $T_D$ becomes stable to be high impedance during the time $t_1$. Therefore, an input data $D_{IN}$ can be supplied to a common input/output terminal during the period $t_1$ to start a cycle of input operation.

Figure 6:
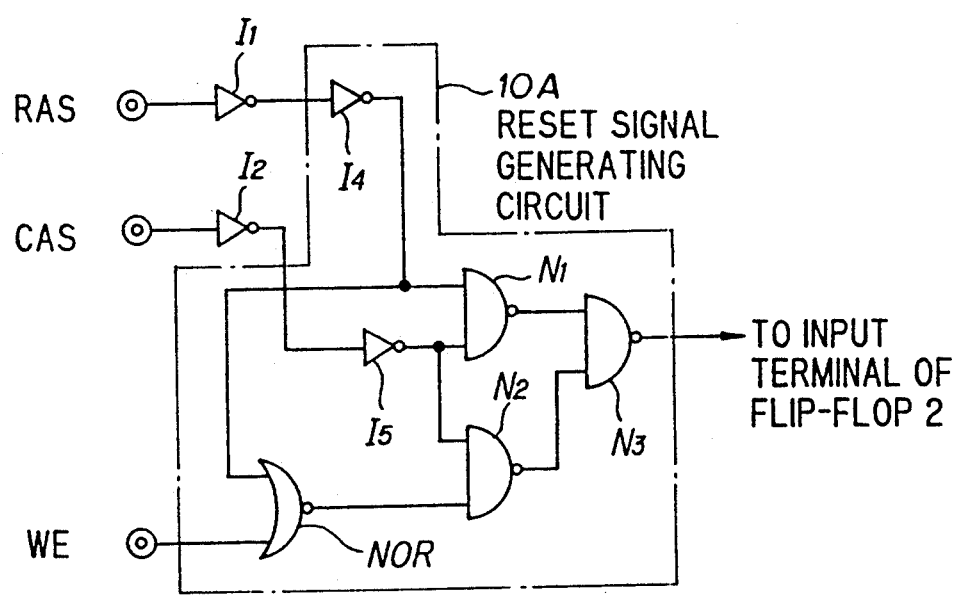
FIG. 6 is a block diagram of a reset signal generating circuit in a circuit for controlling an output of a semiconductor memory in a second preferred embodiment according to the invention.

FIG. 6 is a block diagram of a reset signal generating circuit 10A of a circuit for controlling an output of a semiconductor memory in a second preferred embodiment. The basic circuitry structure of the reset signal generating circuit 10A is the same as the circuit 10 in FIG. 4, except that the inverter $I_3$ of FIG. 4 is replaced with a NOR circuit which is supplied with a WE signal and an output of an inverter $I_4$. In this embodiment, an output of the NOR circuit is dependent on the RAS signal, so that the reset signal generating circuit 10A does not operate regardless of a level of the WE signal, as far as the RAS signal is high in a stand-by state. Therefore, a consumption power of the output control circuit can be reduced.

In the first and second embodiments described above, the flip-flop 2 may include a delay circuit to delay producing an output of the the output terminal Q in case that the RAS and CAS signals become low one by one in a relatively short time, because it is sufficient for the flip-flop 2 to be set by supplying a set signal to the set terminal S at any time under the condition that both the RAS and CAS signals are low.

Furthermore, it is possible to use a logical circuit in which no set signal is applied to the flip-flop 2 during the CBR refreshing operation to provide the high impedance state in the output circuit during the CBR refreshing operation.

Although the invention has been described with respect to specific embodiment for complete and clear disclosure, the appended claims are not to thus limited and alternative constructions that may occur to one skilled in the art which fairly fall within the basic teaching herein set forth.

What is claimed is:

1. A circuit for controlling an output of a semiconductor memory comprising:
    a set signal generating circuit for generating a set signal having a logical level dependent on a row address strobe (RAS) signal and a column address strobe (CAS) signal;
    a reset signal generating circuit for generating a reset signal having a logical level dependent on said RAS signal, said CAS signal, and a write enable (WE) signal;
    a flip-flop coupled to said set signal generating circuit and to said reset signal generating circuit and being set by said set signal and reset by said reset signal;
    an output data retaining circuit coupled to a semiconductor memory cell for retaining data read from the semiconductor memory cell;
    an output circuit, coupled to said output data retaining circuit, for outputting said data read from said semiconductor memory cell; and
    a drive circuit, coupled to the flip-flop, said output data retaining circuit, and said output circuit, for controlling said output circuit to output data from said semiconductor memory cell when said flip-flop is set and for controlling said output circuit to be in a high impedance state regardless of a content of said data when said flip-flop is reset.

2. The circuit for controlling according to claim 1 wherein said reset signal generating circuit supplies said reset signal to said flip-flop when said RAS signal is active, said CAS signal is inactive, and said write enable signal is active.

3. The circuit for controlling according to claim 1 wherein said reset signal generating circuit comprises first to third inverters and first to third NAND circuits, said first inverter being supplied with an inverted signal of said RAS signal, said second inverter being supplied with an inverted signal of said CAS signal, said third inverter being supplied with said WE signal, said first NAND circuit being supplied with outputs of said first and second inverters, said second NAND circuit being supplied with outputs of said second and third inverters, and said third NAND circuit being supplied with outputs of said first and second NAND circuits to supply said reset signal to a reset terminal of said flip-flop.

4. The circuit for controlling according to claim 1 wherein said reset signal generating circuit comprises first and second inverters, a NOR circuit, and first to third NAND circuits, said first inverter being supplied with an inverted signal of said RAS signal, said second inverter being supplied with an inverted signal of said CAS signal, said NOR circuit being supplied with an output of said first inverter and said WE signal, said first NAND circuit being supplied with outputs of said first and second inverters, said second NAND circuit being supplied with outputs of said second inverter and said NOR circuit, and said third NAND circuit being supplied with outputs of said first and second NAND circuits to supply said reset signal to a reset terminal of said flip-flop.

5. The circuit for controlling according to claim 1 wherein said flip-flop is supplied with said set signal which is an AND logic level of inverted signals of said RAS and CAS signals.

6. The circuit for controlling according to claim 1 wherein
    said output data retaining circuit is divided into first and second circuits which supply first and second complementary output data to said drive circuit, said drive circuit consists of first and second AND circuits, and said output circuit consists of first and second transistors gated by outputs of said first and second AND circuits, said first AND circuit of said drive circuit being supplied with said first complementary output data and an output of said flip-flop, said second AND circuit of said drive circuit being supplied with said second complementary output data and said output of said flip-flop, said first transistor of said output circuit being connected at a gate terminal to an output of said first AND circuit at a drain terminal to a power supply $V_{DD}$ and at a source terminal to a common input and output terminal, and said second transistor of said output circuit being connected at a gate terminal to an output of said second AND circuit at a drain terminal to said common input and output terminal and at a source terminal to ground.

7. The circuit for controlling an output of a semiconductor memory according to claim 1 wherein the drive circuit maintains the data output from said output circuit for at least a period when the CAS signal is inactive.

8. A circuit for controlling an output of a semiconductor memory including memory cells, the circuit comprising:

an input/output common terminal, coupled to the memory cells, for outputting a read data signal responsive to data stored in a memory cell selected from the memory cells during a data read cycle and for receiving a write data signal responsive to data to be written into a memory cell selected from the memory cells during a data write cycle;

an output circuit coupled to the input/output common terminal and to the memory cell selected from the memory cells during the data write cycle;

set signal generating means, coupled to the output circuit, responsive to an initiation of the data read cycle, for controlling the output circuit to output the read data signal to the input/output common terminal; and resetting means, coupled to the output circuit, responsive to a write enable signal being activated before the data read cycle is terminated, for controlling the output circuit to be in a high impedance state, the write enable signal indicating that an operation cycle succeeding the data read cycle is the data write cycle, wherein the read data signal output from the input/output common terminal is maintained for at least a predetermined period when a column address strobe (CAS) is inactive.

9. A circuit for controlling an output of a semiconductor memory including memory cells, the circuit comprising:

an input/output common terminal, coupled to the memory cells, for outputting a read data signal responsive to data stored in a memory cell selected from the memory cells during a data read cycle and for receiving a write data signal responsive to data to be written into a memory cell selected from the memory cells during a data write cycle;

an output circuit coupled to the input/output common terminal and to the memory cell selected from the memory cells during the data write cycle;

set signal generating means, coupled to the output circuit, responsive to an initiation of the data read cycle, for controlling the output circuit to output the read data signal to the input/output common terminal; and resetting means, coupled to the output circuit, responsive to a write enable signal being activated before the data read cycle is terminated, for controlling the output circuit to be in a high impedance state, the write enable signal indicating that an operation cycle succeeding the data read cycle is the data write cycle, wherein the resetting means is responsive to a row address strobe (RAS) signal being active, a column address strobe (CAS) signal being inactive, and the write enable signal being active.

10. A circuit for controlling an output of a semiconductor memory having a memory cell, the circuit comprising:

means for receiving a column address strobe, an active state of the column address strobe being indicative of read and write access cycles to the memory cell;

a common input/output terminal;

an output circuit, coupled to the memory cell, for outputting data on the common input/output terminal and for placing the common input/output terminal in a high impedance state;

means for receiving a write enable signal wherein at least a portion of the write enable signal is received a predetermined period prior to initiation of the active state of the column address strobe so that at least a portion of the write enable signal does not overlap the active state of the column address strobe; and control means coupled to the output circuit, the write enable signal receiving means, and the column address signal receiving means for actuating the output circuit of the semiconductor memory to supply data stored in the memory cell and for actuating the output circuit to be in a high impedance state when the write enable signal is generated prior the active state of the column address strobe.

11. The circuit for controlling according to claim 10 wherein the control means includes means for maintaining the supply of the data after the column address strobe becomes inactive.

12. The circuit according to claim 11 wherein the control means includes means for stopping the supply of the data when the write enable signal becomes active.

13. The circuit according to claim 11 further comprising means for receiving a row address strobe (RAS) and wherein the control means includes means for stopping the supply of the data when both the row address strobe and the column address strobe become inactive.

14. The circuit according to claim 11 further comprising means for receiving a row address strobe (RAS) and wherein the control means includes means for stopping the supply of the data to the external circuit when the row address strobe and the write enable signal are both active and the column address strobe is in an inactive state.

* * * * *